(12) United States Patent
Periyannan et al.

(10) Patent No.: US 11,462,497 B2
(45) Date of Patent: Oct. 4, 2022

(54) SEMICONDUCTOR DEVICE INCLUDING COUPLED BOND PADS HAVING DIFFERING NUMBERS OF PAD LEGS

(71) Applicant: WESTERN DIGITAL TECHNOLOGIES, INC., San Jose, CA (US)

(72) Inventors: Kirubakaran Periyannan, Santa Clara, CA (US); Daniel Linnen, Naperville, IL (US); Jayavel Pachamuthu, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 13 days.

(21) Appl. No.: 17/174,657

(22) Filed: Feb. 12, 2021

(65) Prior Publication Data

US 2022/0115343 A1 Apr. 14, 2022

Related U.S. Application Data

(60) Provisional application No. 63/091,371, filed on Oct. 14, 2020.

(51) Int. Cl.
*H01L 23/00* (2006.01)

(52) U.S. Cl.
CPC .............. *H01L 24/08* (2013.01); *H01L 24/05* (2013.01); *H01L 2224/05557* (2013.01); *H01L 2224/0807* (2013.01); *H01L 2224/08145* (2013.01)

(58) Field of Classification Search
CPC ...................... H01L 24/08; H01L 24/05; H01L 2224/05557; H01L 2224/0807; H01L 2224/08145; H01L 2224/1607
See application file for complete search history.

(56) References Cited

U.S. PATENT DOCUMENTS

| 6,306,749 | B1* | 10/2001 | Lin ......................... H01L 24/05 438/622 |
| 10,522,489 | B1* | 12/2019 | Takiar .................... H01L 24/80 |
| 2002/0053735 | A1* | 5/2002 | Neuhaus .............. H05K 3/4007 438/455 |
| 2012/0032318 | A1* | 2/2012 | Sasaki .................... H01L 24/01 257/E21.705 |
| 2013/0299986 | A1* | 11/2013 | Sun ........................ H01L 24/73 438/118 |
| 2014/0252635 | A1* | 9/2014 | Tran ....................... H01L 24/08 257/773 |
| 2015/0187717 | A1* | 7/2015 | Chung ................... H01L 24/24 257/738 |
| 2016/0111386 | A1* | 4/2016 | England ................ H01L 24/03 438/107 |
| 2016/0252688 | A1* | 9/2016 | Barwicz ............... H01S 5/0234 385/14 |

(Continued)

*Primary Examiner* — Mamadou L Diallo
(74) *Attorney, Agent, or Firm* — Vierra Magen Marcus LLP (57) ABSTRACT

A semiconductor device including an integrated module formed of a first semiconductor die coupled to a second semiconductor die. Each of the first and second semiconductor dies includes a number of bond pads, which are bonded to each other to form the integrated module. Each bond pad may be divided into a number of discrete pad legs. While the overall footprint of each bond pad on the first and second semiconductor dies may be the same, the bond pads on one of the dies may have a larger number of pad legs.

20 Claims, 10 Drawing Sheets

(56) References Cited

U.S. PATENT DOCUMENTS

| | | | |
|---|---|---|---|
| 2019/0341375 A1* | 11/2019 | Hirano | H01L 25/0657 |
| 2021/0066222 A1* | 3/2021 | Chen | H01L 23/5226 |
| 2021/0104494 A1* | 4/2021 | Vodrahalli | H01L 25/0652 |
| 2021/0104495 A1* | 4/2021 | Vodrahalli | H01L 23/562 |
| 2021/0167028 A1* | 6/2021 | Hsu | H01L 24/06 |
| 2021/0257266 A1* | 8/2021 | Oh | H01L 25/18 |
| 2021/0358875 A1* | 11/2021 | Lee | H01L 24/96 |
| 2022/0068882 A1* | 3/2022 | Xiao | H01L 25/0657 |

* cited by examiner

SEMICONDUCTOR DEVICE INCLUDING COUPLED BOND PADS HAVING DIFFERING NUMBERS OF PAD LEGS

CLAIM OF PRIORITY

The present application claims priority from U.S. Provisional Patent Application No. 63/091,371, entitled "SEMICONDUCTOR DEVICE INCLUDING COUPLED BOND PADS HAVING DIFFERING NUMBERS OF PAD LEGS," filed Oct. 14, 2020, which application is incorporated by reference herein in its entirety.

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Recently, ultra-high density memory devices have been proposed using a 3D stacked memory structure having strings of memory cells formed into layers. One such storage device is sometimes referred to as a Bit Cost Scalable (BiCS) architecture. In addition to the layered memory cells, 3D memory devices include a logic circuit for controlling read/write to the memory cells. The logic circuit, often fabricated using complementary metal-oxide-semiconductor (CMOS) technology, may typically be formed beneath stacked memory layers within a semiconductor wafer.

Given the difficulty in manufacturing high density semiconductor wafers including both the memory cell arrays and CMOS logic circuits, it is known to fabricate the memory cell arrays and logic circuits as separate semiconductor dies on different wafers. A first wafer includes memory cell array dies having a first set of die bond pads, and a second wafer includes logic circuit dies having a second set of die bond pads. The first and second sets of die bond pads are then bonded to each other to form integrated memory modules.

In coupling the memory cell array dies and logic circuit dies to each other, it can be difficult to accurately align the first and second sets of bond pads to each other. This mismatch, for each bond pad, impedes current flow between the coupled bond pads. In particular, the current flows along the surfaces of the bond pads. When coupled pads are misaligned, this disadvantageously increases the surfaces over which the current flows while travelling between the bond pad.

DETAILED DESCRIPTION

The present technology will now be described with reference to the figures, which in embodiments, relate to a semiconductor device including an integrated memory module. The integrated memory module may include a pair of semiconductor dies, which together, operate as a single, integrated flash memory. In examples, the first die may include the memory cell array and the second die may include the logic circuit such as CMOS integrated circuits.

Each of the first and second semiconductor dies includes a number of bond pads, which are flip-chip bonded to each other to form the integrated memory module. Each bond pad may be divided into a number of discrete pad legs. While the overall footprint of each bond pad on the first and second semiconductor dies may be the same, the bond pads on one of the dies may have a larger number of pad legs. Thus, when the pads are joined to each other, some pad legs on the first semiconductor die will align with pad legs on the second semiconductor die whether the coupled bond pads are aligned or misaligned with each other.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms and synonyms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension.

Figure 1:
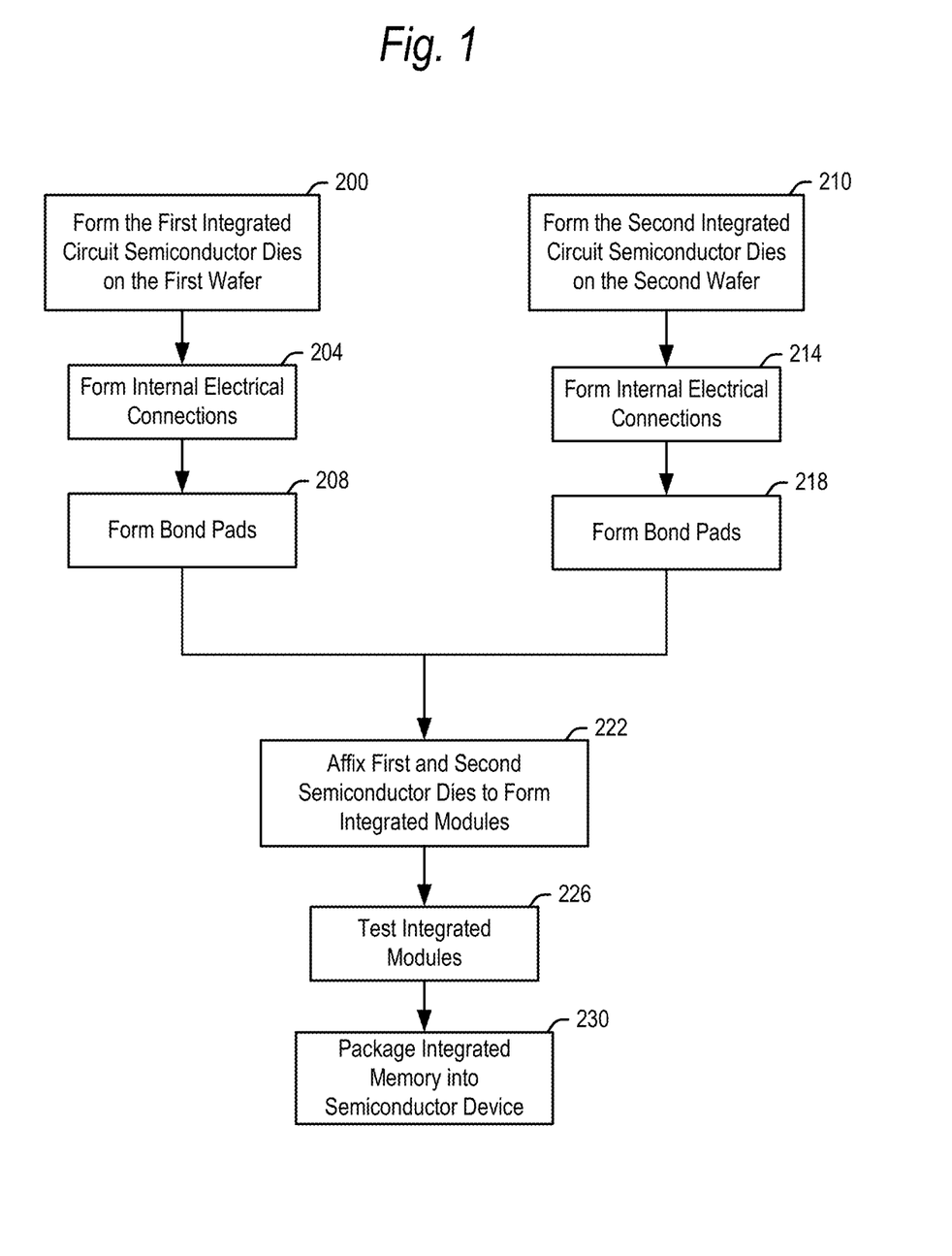
FIG. 1 is a flowchart for forming a semiconductor device according to embodiments of the present technology.
Figure 2:
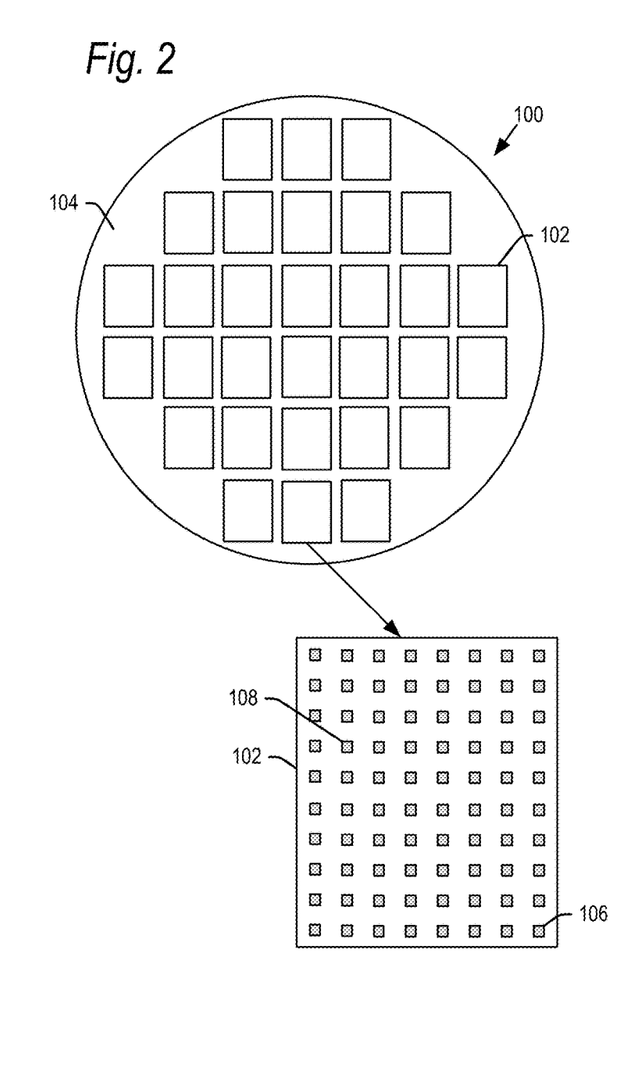
FIG. 2 is a top view of a first semiconductor wafer, and a first semiconductor die therefrom, according to embodiments of the present technology.

An embodiment of the present technology will now be explained with reference to the flowchart of FIG. 1, and the views of FIGS. 2-21. In step 200, a first semiconductor wafer 100 may be processed into a number of first semiconductor dies 102 as shown in FIG. 2. The first semiconductor wafer 100 may start as an ingot of wafer material which may be monocrystalline silicon grown according to either a Czochralski (CZ) or floating zone (FZ) process. However, first wafer 100 may be formed of other materials and by other processes in further embodiments.

The semiconductor wafer 100 may be cut from the ingot and polished on both the first major planar surface 104, and second major planar surface 105 (FIG. 4) opposite surface 104, to provide smooth surfaces. The first major surface 104 may undergo various processing steps to divide the wafer 100 into the respective first semiconductor dies 102, and to form integrated circuits of the respective first semiconductor dies 102 on and/or in the first major surface 104.

Figure 4:
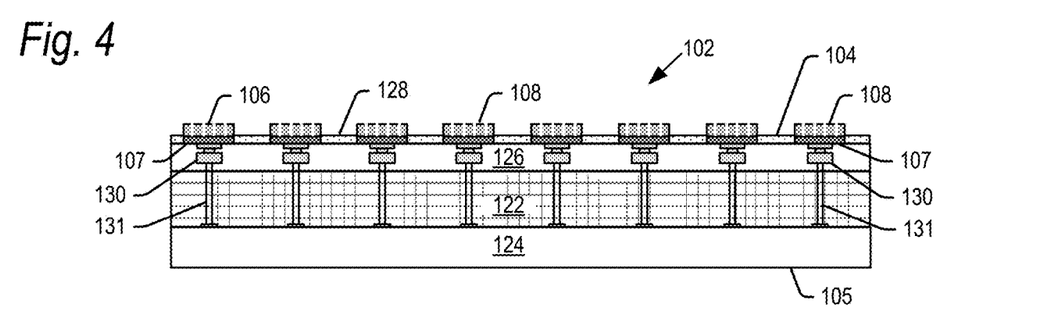
FIG. 4 is a cross-sectional edge view of a first semiconductor die according to embodiments of the present technology.

Although not critical to the present technology, the first semiconductor die 102 may be processed to include integrated circuit memory cell array 122 formed in a dielectric substrate including layers 124 and 126 as shown in the cross-sectional edge view of FIG. 4. In embodiments, the memory cell array 122 may be formed as a 3D stacked memory structure having strings of memory cells formed into layers. However, it is understood that the first semiconductor die 102 may be processed to include integrated circuits other than a 3D stacked memory structure. A passivation layer 128 may be formed on top of the upper dielectric film layer 126.

After formation of the memory cell array 122, internal electrical connections may be formed within the first semiconductor die 102 in step 204. The internal electrical connections may include multiple layers of metal interconnects 130 and vias 131 formed sequentially through layers of the dielectric film 126. As is known in the art, the metal interconnects 130, vias 131 and dielectric film layers 126 may be formed a layer at a time using photolithographic and thin-film deposition processes. The photolithographic processes may include for example pattern definition, plasma, chemical or dry etching and polishing. The thin-film deposition processes may include for example sputtering and/or chemical vapor deposition. The metal interconnects 130 may be formed of a variety of electrically conductive metals including for example copper and copper alloys as is known in the art, and the vias 131 may be lined and/or filled with a variety of electrically conductive metals including for example tungsten, copper and copper alloys as is known in the art.

In step 208, bond pads may be formed on the major planar surface 104 of the first semiconductor dies 102. As shown in FIGS. 2 and 4, these bond pads may include a row of bond pads 106 and flip-chip bond pads 108. The flip-chip bond pads 108 are provided for flip-chip bonding to a like pattern of bond pads 118 on a surface of a second semiconductor die 112 as explained below. In accordance with aspects of the present technology, each bond pad 108 may be divided into a pattern of discrete pad legs as is also explained below. The bond pads 106 are provided for transferring signals between the pair of semiconductor die 102, 112 and a host device. The bond pads 106 need not be divided into discrete bond legs, though they may in further embodiments.

The passivation layer 128 may be etched, and each bond pad 106, 108 may be formed over a liner 107 in the etched regions of the passivation layer. As is known in the art, the bond pads 106, 108 may be formed for example of copper, aluminum and alloys thereof, and the liner 107 may be formed for example of a titanium/titanium nitride stack such as for example Ti/TiN/Ti, though these materials may vary in further embodiments. The bond pads 106, 108 and liner 107 may be applied by vapor deposition and/or plating techniques. The bond pads and liners together may have a thickness of 720 nm, though this thickness may be larger or smaller in further embodiments. The integrated circuits 122 may be electrically connected to the bond pads 106 and/or 108 by the metal interconnects 130 and vias 131.

FIG. 2 shows semiconductor dies 102 on wafer 100, and bond pads 106, 108 in a grid pattern on one of the semiconductor dies 102. The number of first semiconductor dies 102 shown on wafer 100 in FIG. 2 is for illustrative purposes, and wafer 100 may include more first semiconductor dies 102 than are shown in further embodiments. Similarly, the pattern of bond pads 106, 108, as well as the number of bond pads 106, 108, on the first semiconductor die 102 are shown for illustrative purposes. Each first die 102 may include more or less bond pads 106, 108 than are shown in further embodiments, and may include various other patterns of bond pads 106, 108.

Figure 3:
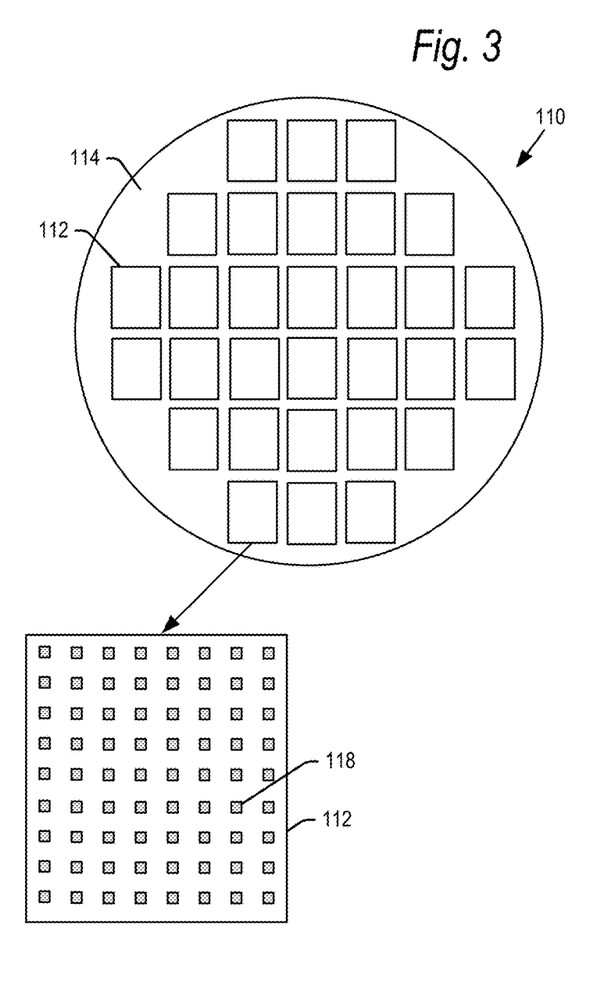
FIG. 3 is a top view of a second semiconductor wafer, and a second semiconductor die therefrom, according to embodiments of the present technology.

Before, after or in parallel with the formation of the first semiconductor dies on wafer 100, a second semiconductor wafer 110 may be processed into a number of second semiconductor dies 112 in step 210 as shown in FIG. 3. The semiconductor wafer 110 may start as an ingot of monocrystalline silicon grown according to either a CZ, FZ or other process. The second semiconductor wafer 110 may be cut and polished on both the first major surface 114, and second major surface 115 (FIG. 5) opposite surface 114, to provide smooth surfaces. The first major surface 114 may undergo various processing steps to divide the second wafer 110 into the respective second semiconductor dies 112, and to form integrated circuits of the respective second semiconductor dies 112 on and/or in the first major surface 114.

Figure 5:
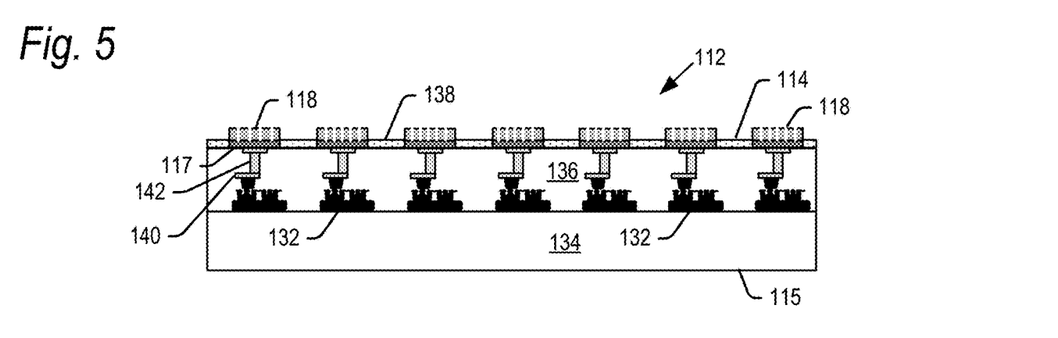
FIG. 5 is a cross-sectional edge view of a second semiconductor die according to embodiments of the present technology.

In one embodiment, the second semiconductor dies 112 may be processed to include integrated circuits 132 formed in a dielectric substrate including layers 134 and 136 as shown in the cross-sectional edge view of FIG. 5. Although not critical to the present technology, integrated circuits 132 may be configured as logic circuits to control read/write operations for one or more integrated memory cell arrays. The logic circuits may be fabricated using CMOS technology, though the logic circuits may be fabricated using other technologies in further embodiments. The second semiconductor dies 112 may include other and/or additional integrated circuits in further embodiments as explained below. A passivation layer 138 may be formed on top of the upper dielectric film layer 136.

After formation of the integrated circuits 132, internal electrical connections may be formed within the second semiconductor die 112 in step 214. The internal electrical connections may include multiple layers of metal interconnects 140 and vias 142 formed sequentially through layers of the dielectric film 136. The metal interconnects 140 and vias 142 may be formed of the same materials and in similar processes to interconnects 130 and vias 131 described above (though in different patterns).

In step 218, bond pads may be formed on the major planar surface 114 of the second semiconductor dies 112. As shown in FIGS. 3 and 5, these bond pads may include flip-chip bond pads 118. The bond pads 118 may match the bond pads 108 in pattern, size, pitch and number. As with bond pads 108, bond pads 118 may also be divided into a pattern of discrete pad legs. However, in accordance with the present technology, the number of pad legs in each bond pad 118 may be different than the number of pad legs in each bond pad 108.

The passivation layer 138 may be etched, and each bond pad 118 may be formed over a liner 117 in the etched regions of the passivation layer. The bond pads 118 and liner 117 may be formed of the same materials and in the same manner as bond pads 108 and liner 107 on the first semiconductor dies 102 described above. The integrated circuits 132 of the second semiconductor dies 112 may be electrically connected to the bond pads 118 by the metal interconnects 140 and vias 142.

FIG. 3 shows the second semiconductor dies 112 on wafer 110, and a grid pattern of bond pads 118 on one of the second semiconductor dies 112. The number of second semiconductor dies 112 shown on wafer 110 in FIG. 3 is for illustrative purposes, and wafer 110 may include more second semiconductor dies 112 than are shown in further embodiments. Similarly, the pattern of bond pads 118, as well as the number of bond pads 118, on the second semiconductor die 112 are shown for illustrative purposes. Each second die 112 may include more bond pads 118 than are shown in further embodiments, and may include various other patterns of bond pads 118, matching the pattern of bond pads 108 on first dies 102.

Figure 6:
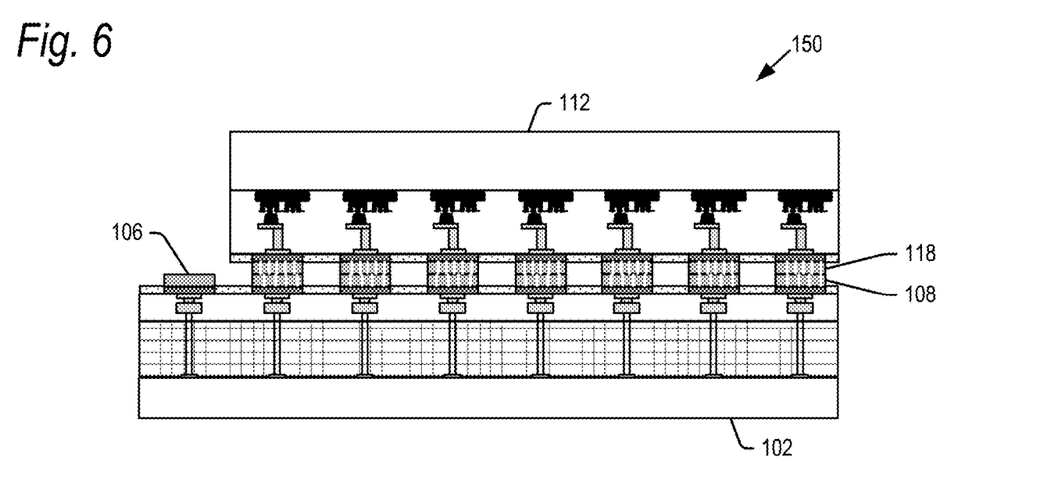
FIG. 6 is a cross-sectional edge view of an integrated memory module including a first semiconductor die bonded to a second semiconductor die according to embodiments of the present technology.

Once the fabrication of first and second semiconductor dies 102 and 112 is complete, the first and second semiconductor dies may be affixed to each other in step 222 to form an integrated memory module 150 as shown for example in the cross-sectional edge view of FIG. 6. In particular, the second semiconductor die 112 may be flipped over (relative to the views of FIGS. 3 and 5), and bond pads 108 and 118 of the respective dies 102 and 112 may be physically and electrically coupled to each other. In embodiments, the size of the second semiconductor dies 112 may be slightly smaller than the size of the first semiconductor dies 102. Thus, when the first and second dies are coupled together as shown in FIG. 6, the bond pads 106 on the first semiconductor dies remain uncovered and accessible from above.

The first and second semiconductor dies 102, 112 in the integrated memory module 150 may be bonded to each other by initially aligning the bond pads 108 and 118 on the respective dies 102, 112 with each other. Thereafter, the bond pads 108, 118 may be bonded together by any of a variety of bonding techniques, depending in part on bond pad size and bond pad spacing (i.e., bond pad pitch). The bond pad size and pitch may in turn be dictated by the number of electrical interconnections required between the first and second semiconductor dies 102 and 112.

In embodiments, the first semiconductor dies 102 may include only memory array circuits, and all supporting control circuitry may be off-loaded to the second dies 112. Such embodiments may have advantages, but require a large number of electrical interconnections between the first and second dies 102 and 112, including large numbers of bond pads 108 and 118. In one example, 100,000 or more interconnections may be required. In order to support such large numbers of electrical interconnections, the bond pads 108 and 118 may be provided with a small area and pitch. Such embodiments are shown and described for example with respect to FIGS. 7 and 8. It is understood that smaller numbers of interconnections may be made between dies 102 and 112 in further embodiments, and bonding techniques other than those described below may be used.

Figure 7:
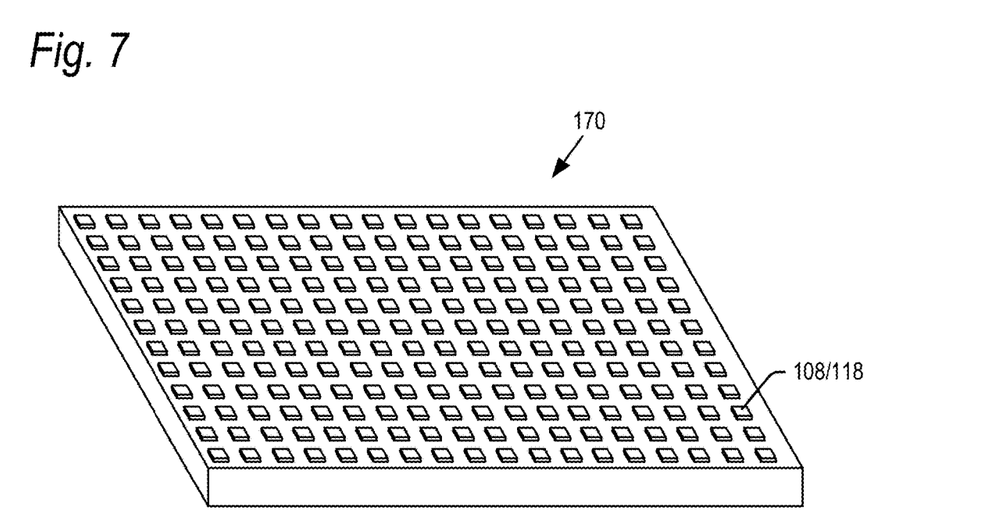
FIGS. 7-8 are perspective views showing various bond pad patterns on one of the first and second semiconductor die according to embodiments of the present technology.

It is known to bond the bond pads 108, 118 directly to each other, without solder or other added material, in a so-called Cu-to-Cu bonding process. Such an example is shown in FIG. 7. In a Cu-to-Cu bonding process, the bond pads 108, 118 are formed in a highly controlled environment largely devoid of ambient particulates that might otherwise settle on a bond pad 108 and/or 118 and prevent a close bond. Under such properly controlled conditions, the bond pads 108, 118 are pressed against each other to form a mutual bond based on surface tension. Such bonds may be formed at room temperature, though heat may also be applied. In embodiments using Cu-to-Cu bonding, the bond pads 108, 118 may be about 5 µm square and spaced from each other with a pitch of 3 µm to 5 µm. While this process is referred to herein as Cu-to-Cu bonding, this term may also apply even where the bond pads 108, 118 are formed of materials other than Cu.

When the area of bond pads 108, 118 are small, it may be difficult to bond the first and second semiconductor dies 102, 112 together. The size of, and pitch between, bond pads 108, 118 may be further reduced by providing a film layer on the surfaces of the first dies 102 including the bond pads 108, and a film layer on the surface of the second dies 112 including the bond pads 118. Such an embodiment shown in FIG. 8. The film layer 147 is provided around the bond pads 108, 118. When the first and second dies 102, 112 are brought together, the bond pads 108, 118 may bond to each other, and the film layers 147 on the respective dies may bond to each other. Such a bonding technique may be referred to as hybrid bonding. In embodiments using hybrid bonding, the bond pads 108, 118 may be about 3 µm square and spaced from each other with a pitch of 1 µm to 5 µm. Bonding techniques may be used providing bond pads 108, 118 with you in smaller sizes and pitches.

Figure 8:
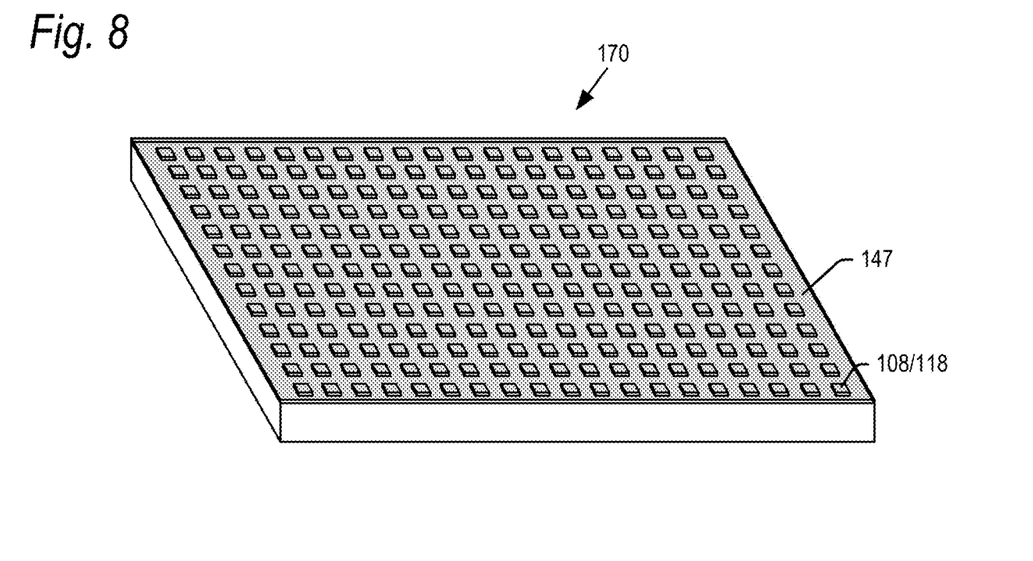

FIGS. 7 and 8 show bond pads 108/118 on a component 170. In embodiments, the component 170 may be a first semiconductor die (e.g., die 102) which bonds to a second component 170, for example a second semiconductor die (e.g., die 112). However, in further embodiments, component 170 may be a substrate, such as a printed circuit board, including a pattern of bond pads (e.g., bond pads 108). When it is a substrate, the component 170 may receive a semiconductor die (e.g., die 112) so that bond pads 108 of the substrate are physically and electrically coupled with bond pads 118 of die 112 as described herein. When it is a substrate, the component 170 may receive another, like substrate so that the bond pads 108 of the first substrate are physically and electrically coupled with bond pads 118, as described herein, of the second substrate.

When bonding semiconductor dies 102, 112 to each other by Cu-to-Cu bonding, hybrid bonding or other bonding scheme, it may happen that the bond pads to be coupled together have some misalignment. As noted in the Background section, such misalignment may impede current flow between coupled bond pads. As such, in accordance with aspects of the present technology, some or all of the bond pads 108 and some or all of the bond pads 118 may be divided into discrete pad legs. Aspects of bond pads having discrete pad legs will now be described with reference to FIGS. 9-17. While the pad legs of a single pair of coupled bond pads 108, 118 are described, the following may apply to each pair of coupled bond pads 108, 118.

Figure 9:
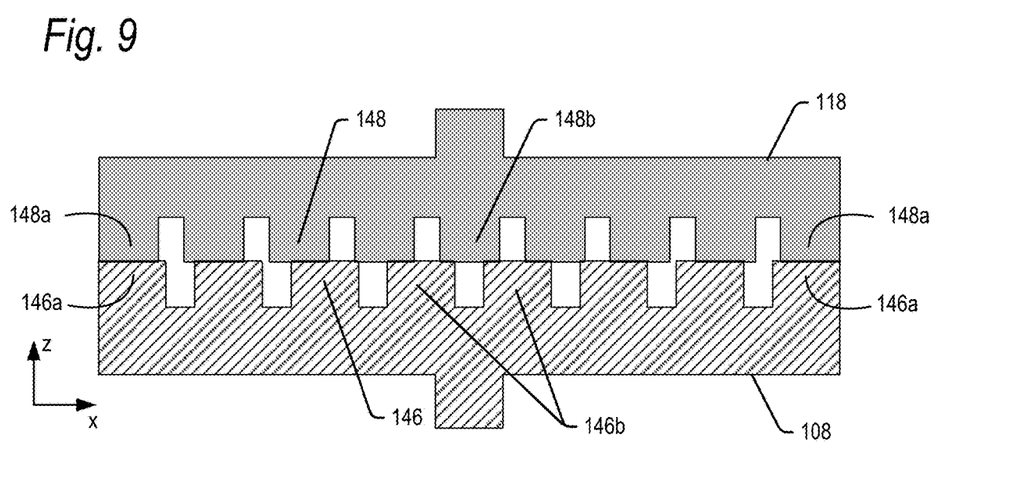
FIGS. 9-10 are edge and top views showing a contact pad from the first and second semiconductor dies divided into different numbers of pad legs.
Figure 10:
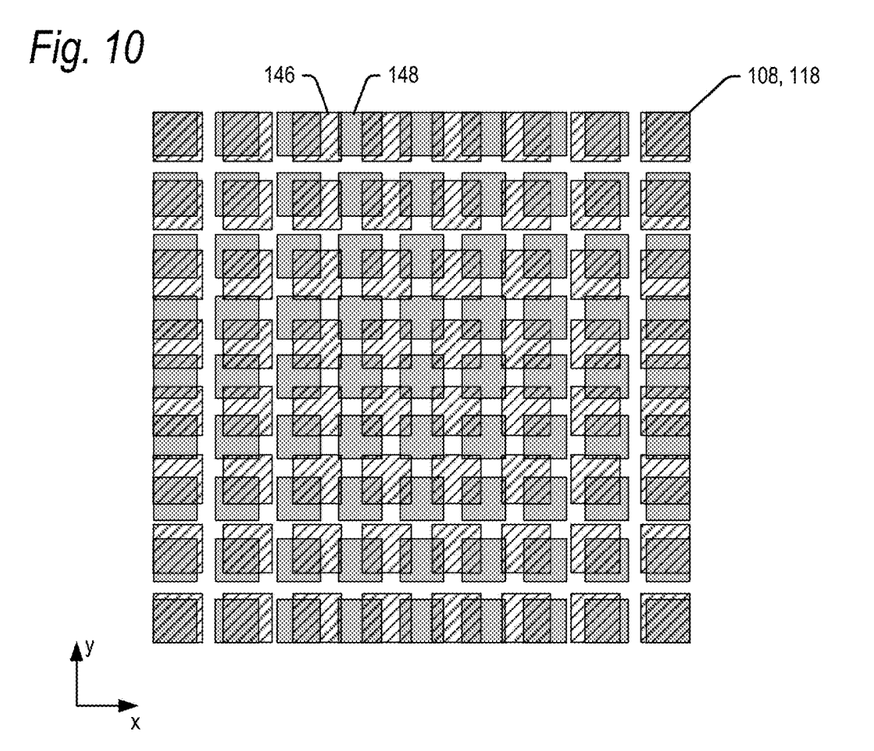

Referring initially to FIGS. 9 and 10, there is shown an edge and top view of a single bond pad 108 bonded to a single bond pad 118. The bond pad 108 is divided into discrete pad legs 146, and the bond pad 118 is divided into discrete pad legs 148. In accordance with the present technology, the number of pad legs 146 is different than the number of bond legs 148. The footprint of both bond pads 108 and 118 may be the same size as each other. Each of the pad legs 146 on bond pad 108 may be the same size as each other, and may be evenly spaced across the surface of bond pad 108. Similarly, each of the pad legs 148 on bond pad 118 may be the same size as each other, and may be evenly spaced across the surface of bond pad 118.

As there are more pad legs 148 than there are pad legs 146 in the same overall footprint of the bond pads 108, 118, pad legs 148 are smaller than pad legs 146. Given the different sizes of pad legs 146 and 148, some of the pad legs 146, 148 align with each other, while others do not, as shown in FIGS. 9 and 10. For example, in FIG. 9, pad legs 146*a* align with pad legs 148*a*, while pad legs 146*b* are misaligned with pad legs 148*b*.

The size of the pad legs may vary in embodiments, but in one example, each pad leg 146 may have a length along both the x- and y-axes of between 50 nanometers (nm) and 1000 nm, such as for example 200 nm. The size of each pad leg 148 may be 10% smaller along both the x- and y-axes, such as for example 180 nm. The pitch (spacing) between each pad leg 146 may be between 50 nm and 1000 nm, such as for example 200 nm. The pitch between each pad leg 148 may be 10% smaller along both the x- and y-axes, such as for example 180 nm. These numbers are by way of example only and both the size and pitch may vary in further embodiments. Moreover, the comparative sizes of pad legs 146 and 148, and the pitches therebetween, may vary in further embodiments. In one further example, the size of the pads 146 and 148 may be the same, but the pitch between the pad legs 148 may be smaller (such as for example 20% smaller) than the pitch between the pad legs 146.

The individual pad legs may be defined within each bond pad by etching between the pad legs using photolithography, lasers, chemical etching or other known methods. The pad legs may be defined when the bond pad 108 and 118 are being formed, or after the bond pads 108 and 118 are formed. The pad legs may be etched down through the entire bond pad to liner 107, 117 (FIGS. 4 and 5), or the pad legs may be etched partially down through the bond pads 108, 118.

As shown in FIG. 10, which shows a top view of the pad legs 148 mounted on the pad legs 146, each pad leg 146 and 148 may be square with a length along the x-direction being the same as the length along the y-direction. Thus, there may be more pad legs 148 in both the x- and y-directions than there are pad legs 146. This results in some pad legs 146 and 148 being misaligned, and some being aligned, in both the x-direction and the y-direction. As discussed below, the pad legs 146 and/or 148 need not be square in further embodiments.

Figure 11:
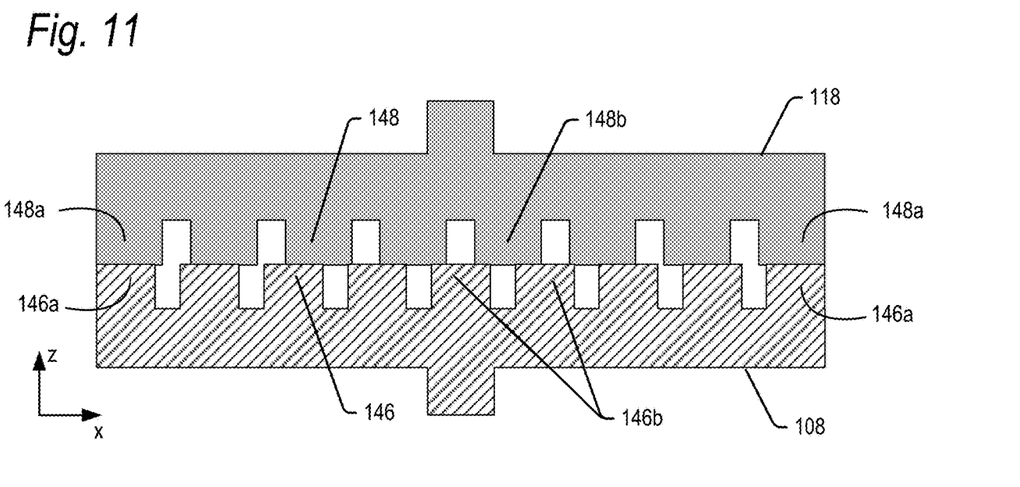
FIGS. 11-12 are edge and top views showing a contact pad from the first and second semiconductor dies divided into different numbers of pad legs according to a further embodiment of the present technology.
Figure 12:
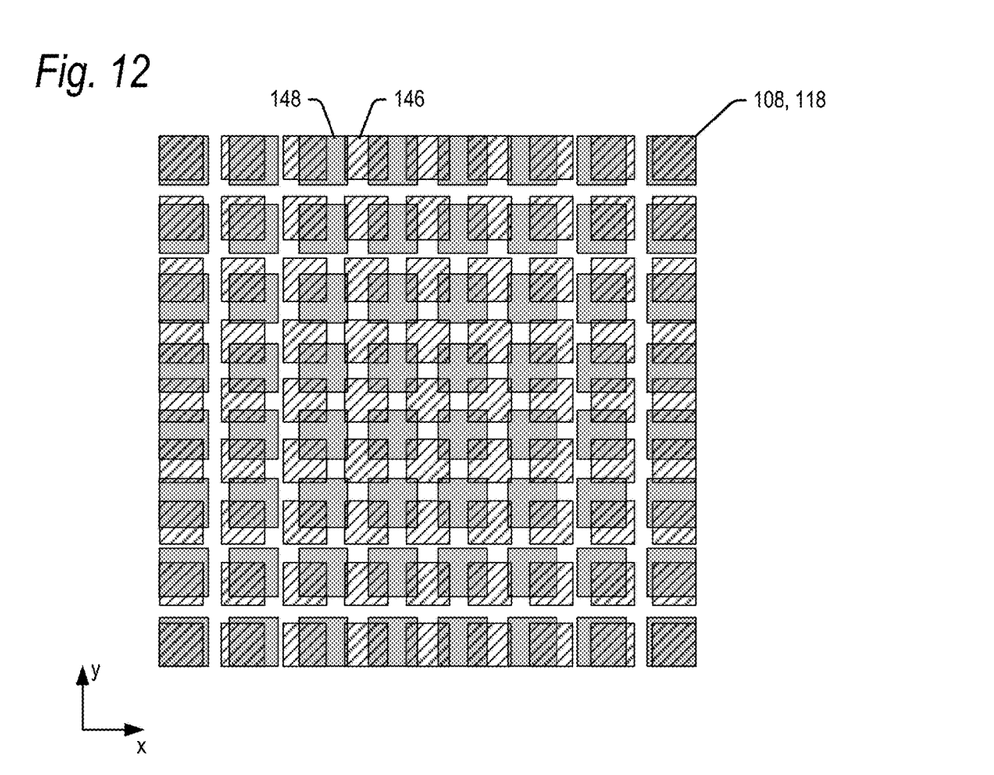

In the example of FIGS. 9 and 10, the pad legs 146 of bond pads 108 were larger and smaller in number than the pad legs 148 of bond pads 118. This may be reversed as shown in FIGS. 11 and 12. The edge and top views of FIGS. 11 and 12 show pad legs 146 of bond pads 108 that are smaller and larger in number than the pad legs 148 of bond pads 118. Thus, as above, some of the pad legs 146 will align with pad legs 148 (pad legs 146*a*, 148*a*) while others are misaligned (146*b*, 148*b*). As seen in FIG. 12, there may be more pad legs 146 in both the x- and y-directions than there are pad legs 148. This results in some pad legs 146 and 148 being misaligned, and some being aligned, in both the x-direction and the y-direction.

In the example above, the sizes and/or pitch of the pad legs 146, 148 differ from each other along both the x- and y-axes. In further embodiments, the size and/or pitch of the pad legs 146, 148 may differ from each other along one axis, but may be the same along the second axis. Such an example is shown in the front edge, top and side edge views of FIGS. 13, 14 and 15 respectively.

Figure 13:
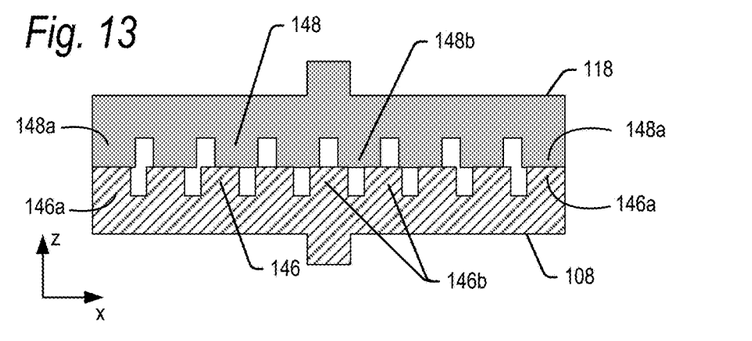
FIGS. 13-15 are front edge, top and side edge views showing a contact pad from the first and second semiconductor dies divided into different numbers of pad legs according to a further embodiment of the present technology.
Figure 14:
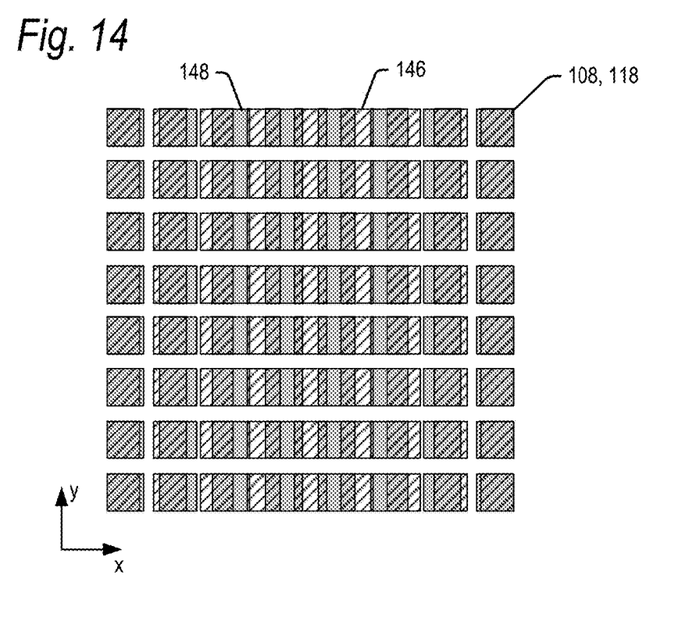
Figure 15:
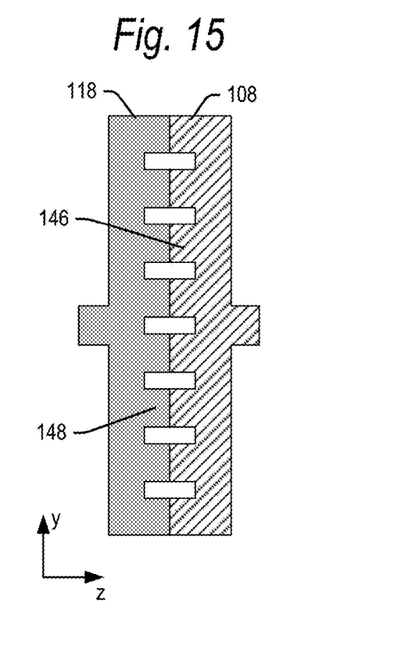

As seen in FIGS. 13 and 14, the pad legs 146 may be smaller and/or have a smaller pitch than the pad legs 148 along the x-direction. The pad legs 148 may be smaller and/or have a smaller pitch than the legs 146 along the x-direction in further embodiments. However, as seen in FIGS. 14 and 15, the pad legs 146 and 148 may have the same length and pitch along the y-direction. The x- and y-dimensions are arbitrary, and the pad legs 146, 148 may be the same along the x-axis and differ from each other along the y-axis in further embodiments.

Figure 16:
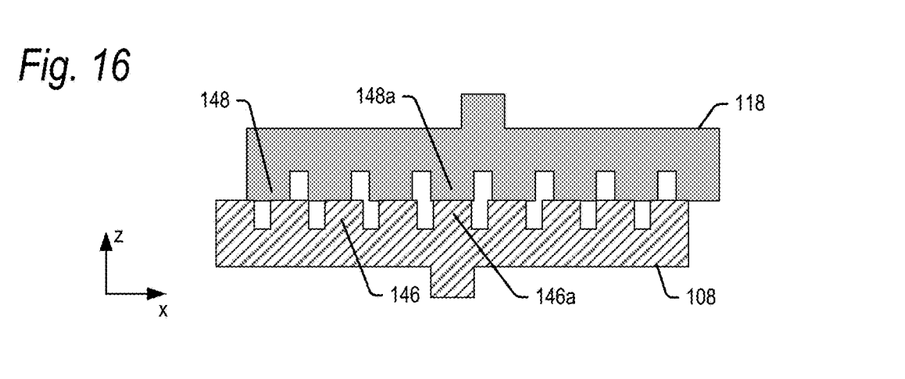
FIG. 16 is an edge view showing a contact pad from the first and second semiconductor dies mounted in a misaligned fashion.

As discussed above, when bond pads 108 and 118 are bonded to each other, there may be an unintended misalignment along the x-axis and/or y-axis. For example, FIG. 16 shows an edge view with the bond pad 108 misaligned with the bond pad 118 along the x-axis. However, the different size and/or pitch of the pad legs 146 and 148 at least some of the pad legs 146 (i.e., 146*a*) align with pad legs 148 (i.e., 148*a*) to ensure good current flow between the pad legs and bond pads.

Figure 17:
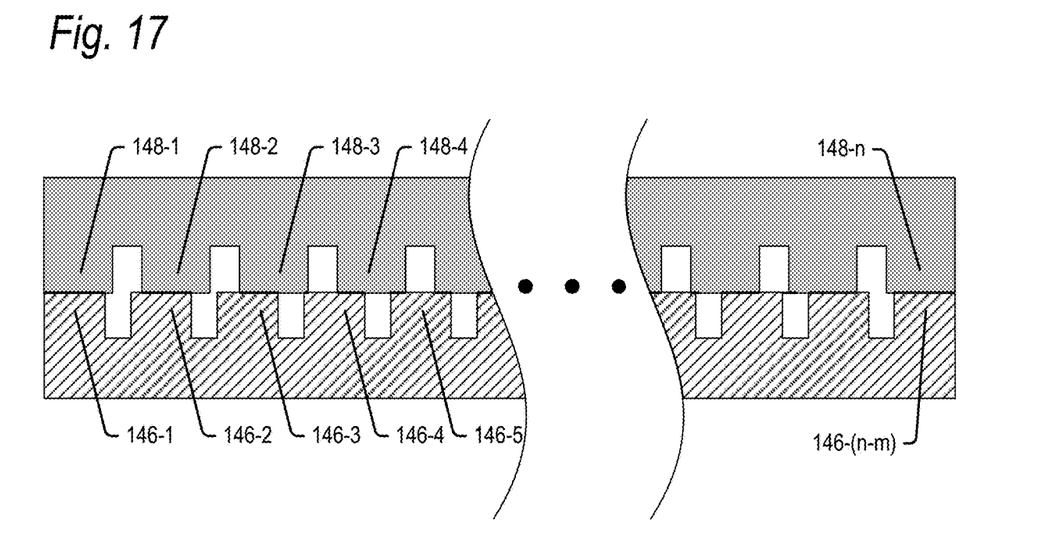
FIGS. 17 and 18 are edge views showing a generalized case of a contact pad from the first and second semiconductor dies divided into different numbers of pad legs.

In the embodiments described above, there may be eight pad legs 146 in each of the x- and y-directions, and one more pad leg 148 in each of the x- and y-directions. These numbers may vary in further embodiments. FIG. 17 shows a generalized case where there are n numbers of pad legs 148 in the x- and/or y-directions on bond pad 118, and n-m pad legs 146 in the x- and/or y-directions on bond pad 108. The value m may be 1 (one less pad leg 148 than pad legs 146), 2 (two less pad legs 148 than pad legs 146), 3 (three less pad legs 148 than pad legs 146), etc. In embodiments, the number n of pad legs 148 may range between 4 and 20, though there may be fewer or greater than that in further embodiments. The value m may range between 1 and 10, though it may be higher than that in further embodiments.

Figure 18:
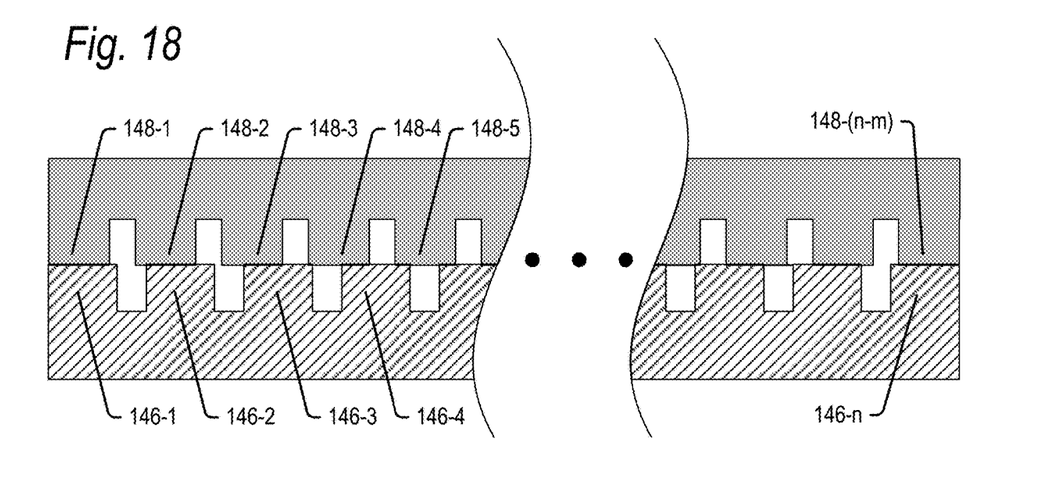
Figure 19:
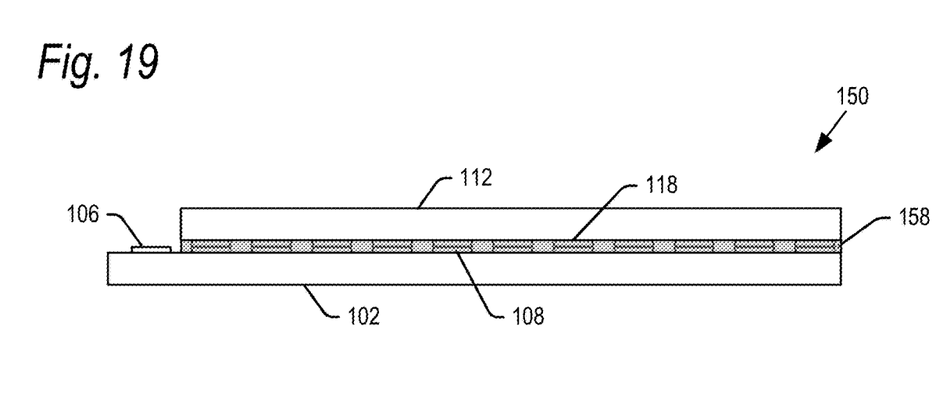
FIGS. 19 and 20 are edge and perspective views showing an integrated memory module according to embodiments of the present technology.
Figure 20:
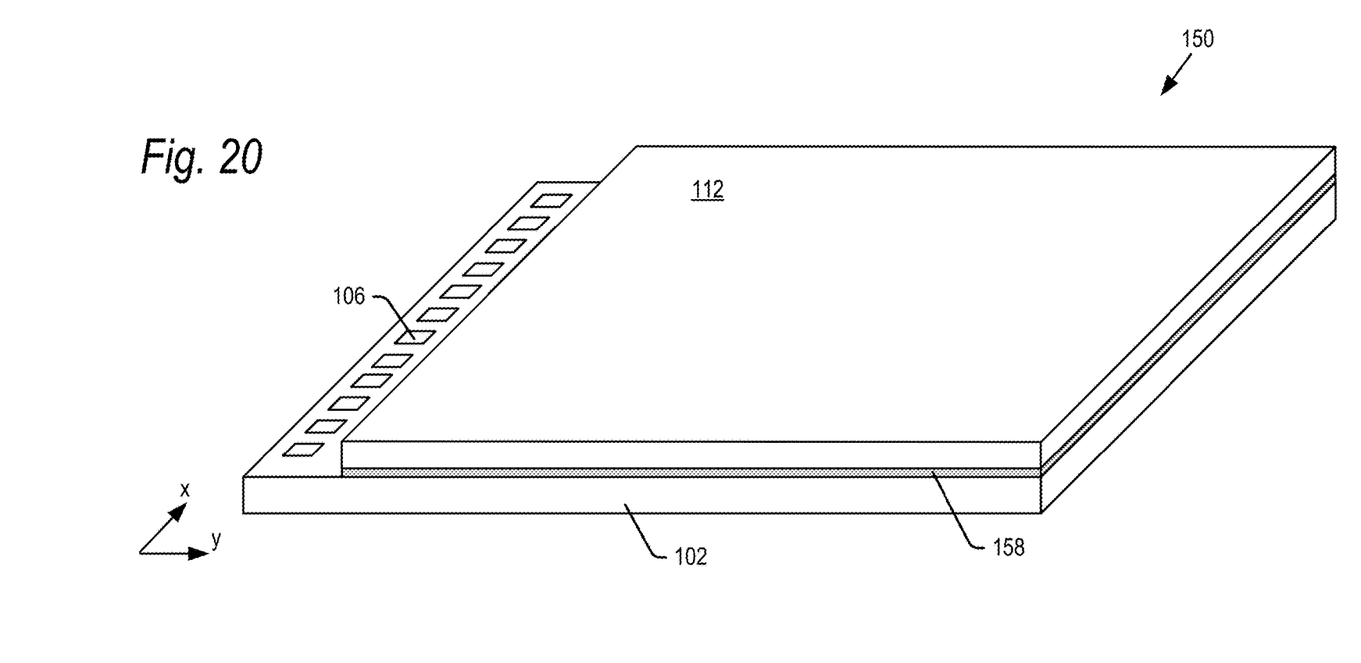

FIG. 18 shows the converse generalized case where there are less pad legs 148 than there are pad legs 146. There may be n numbers of pad legs 146 in the x- and/or y-directions on bond pad 108, and n-m pad legs 148 in the x- and/or y-directions on bond pad 118. As above, the number n of pad legs 146 may range between 4 and 20, though there may be fewer or greater than that in further embodiments. As above, the value m may range between 1 and 10, though it may be higher than that in further embodiments.

Once the respective pad legs and bond pads of semiconductor dies 102 and 112 are coupled to each other in step 222, the first and second semiconductor dies 102 and 112 together may form an integrated memory module 150. Examples of the integrated memory module 150 are shown in FIG. 6 described above, as well as in the edge and perspective views of FIGS. 19 and 20. As shown, once coupled together, the bond pads 106 may remain exposed to enable connection of the integrated memory module 150 to a host device or other components. The bond pads 106 may be formed as in any of the above-described embodiments of bond pads 108. The bond pads 106 need not be divided into individual pad legs as described above, though them may be in further embodiments.

As noted above, some embodiments may include a film 147 (FIG. 8) on surface of the first and second dies 102, 112. Where no such film is initially provided, a space between the first and second dies may be under filled with an epoxy or other resin or polymer 158 (FIGS. 12 and 13). The under-fill material 158 may be applied as a liquid which then hardens into a solid layer. This under-fill step protects the electrical connections between the first and second dies 102, 112, and further secures the second die 112 onto the first die 102. Various materials may be used as under-fill material 158, but in embodiments, it may be Hysol epoxy resin from Henkel Corp., having offices in California, USA.

In embodiments, the bonded dies 102 and 112 together form the integrated memory module 150, which may function as a single, complete integrated flash memory, such as for example a BiCS flash memory. The flash memory is bifurcated into two separate semiconductor dies which are assembled together. Forming the integrated memory module 150 from separate semiconductor dies has several advantages over conventional flash memory dies formed on a single die. For example, where the first dies 102 includes memory cell arrays, removal of the logic circuit from the first dies frees up valuable space in each first die for additional memory cells. For example, where the memory cells are configured as a layered 3D memory stack, removal of the logic circuit allows additional layers to be provided in the memory stack.

Moreover, separation of the memory cells and the logic circuits into separate wafers allows the fabrication processes for the wafers to be customized and optimized for the particular integrated circuits formed on the respective wafers. For example, conventional processes for forming flash memory integrated circuits involve a heat step which could be detrimental to the CMOS logic circuits. By fabricating the logic circuits on their own wafer, this problem may be alleviated.

It is understood that the division of the memory cell arrays and control logic between the two different dies 102, 112 may vary in embodiments. Some of the memory array components described above as being part of die 102 may be provided on the logic die 112, while some of the logic components described above as being part of die 112 may be provided on memory array die 102.

However, formation of an integrated memory module 150 from dies 102 and 112 is not critical to the present technology. The dies 102 and 112, including pad legs on bond pads 108 and 118 according to the present technology, may form other types of integrated modules in further embodiments. In such further embodiments, the die 102 may not be a memory array semiconductor die, and/or the die 112 may not be a CMOS logic circuit semiconductor die. In such embodiments, module 150 may more generally be referred to as an integrated module 150.

Referring again to FIG. 1, after the first and second dies 102, 112 are formed and coupled to each other to form integrated module 150, the module 150 may be tested in step 226 as is known, for example with read/write and burn in operations. Thereafter, the integrated module 150 may be packaged into a semiconductor device, possibly including multiple integrated modules 150. While a wide variety of packaging configurations are known, FIG. 21 shows one such example.

Figure 21:
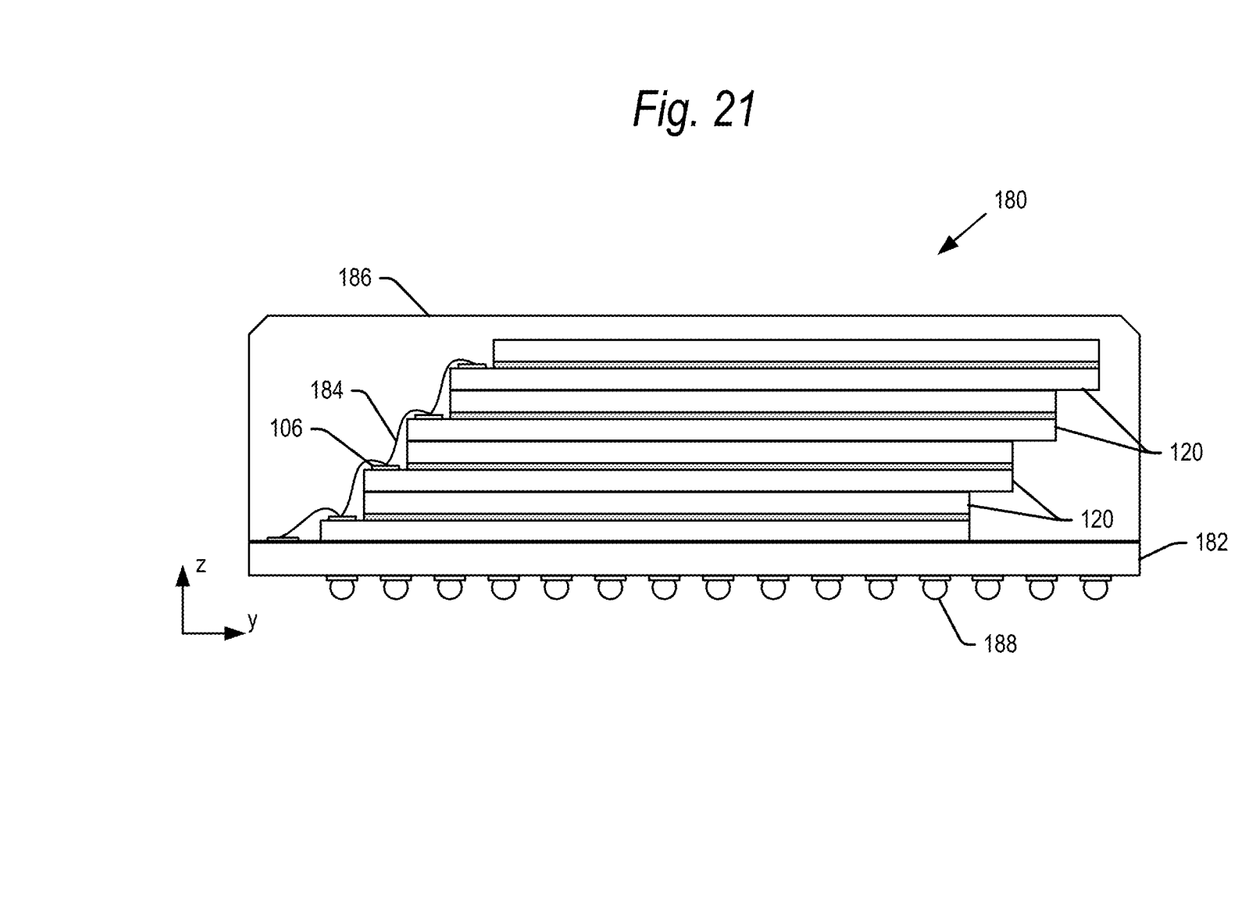
FIG. 21 is an example of a semiconductor device including a number of stacked integrated memory modules according to embodiments of the present technology.

FIG. 21 shows a semiconductor device 180 including a number of integrated modules 150 stacked on each other and a substrate 182, for example using a die attach film (DAF) on a bottom surface of the first semiconductor dies 102 of each module 150. The integrated modules 150 may for example be stacked with a stepped offset, leaving the bond pads 106 at each level uncovered and accessible from above. The integrated modules 150 may be wire bonded to each other and the substrate 182 using wire bonds 184 affixed to the bond pads 106 at each level. A number of such wire bonds may be formed across the width of each integrated module 150 (i.e., into the page of FIG. 21). The semiconductor device 180 may be encapsulated in a mold compound 186 to encase and protect the various dies 102 and 112 as well as wire bonds 184.

Solder balls 188 may optionally be affixed to contact pads on a lower surface of substrate 182 of the semiconductor device 180. The solder balls 188 may be used to electrically and mechanically couple the semiconductor device 180 to a host device (not shown) such as a printed circuit board. Solder balls 188 may be omitted where the semiconductor device 180 is to be used as an LGA package.

In embodiments of the present technology, the first and second dies 102, 112 may both be diced from the first and second wafers 100, 110 before the dies 102, 112 are coupled together. In further embodiments, individual second semiconductor dies 112 may be diced from wafer 110 and mounted on a first wafer 100 of (undiced) first dies 102. The first wafer 100 in this embodiment may then be diced into multiple integrated modules 150, or used as a single integrated module 150 having multiple second semiconductor dies 112 on the surface of wafer 100. In a further embodiment, an undiced second wafer 110 of one or more second semiconductor dies may be mounted on top of an undiced first wafer 100 of one or more first semiconductor dies 102. The first and second wafers 100, 110 in this embodiment may then be diced into multiple integrated modules 150. Alternatively, the first and second wafers may be used as a single integrated memory module 150. Vias may be formed through the wafer 110 to allow access and external connection to bond pads 106.

For purposes of this document, a connection may be a direct connection or an indirect connection (e.g., via one or more other parts). In some cases, when an element is referred to as being connected, affixed or coupled to another element, the element may be directly connected to the other element or indirectly connected to the other element via intervening elements. When elements are referred to as being directly connected, directly affixed or directly coupled to each other, then there are no intervening elements between the directly connected, directly affixed or directly coupled elements.

In summary, an example of the present technology relates to an integrated module comprising: a first semiconductor die comprising at least a first group of bond pads, a first bond pad of the first group of bond pads divided into a first plurality of pad legs; and a second semiconductor die comprising a second group of bond pads, a second bond pad of the second group of bond pads divided into a second plurality of pad legs, there being a different number of pad legs in the second plurality of bond legs than in the first plurality of bond legs, the second bond pad coupled to the first bond pad to electrically and physically couple the second semiconductor die to the first semiconductor die.

In another example, the present technology relates to an integrated module comprising: a first semiconductor die comprising at least a first group of bond pads, a first bond pad of the first group of bond pads divided into a first plurality of pad legs; and a second semiconductor die comprising a second group of bond pads, a second bond pad of the second group of bond pads divided into a second plurality of pad legs; wherein a first set of one or more pad legs of the first plurality of plurality of pad legs aligns with a second set of one or more pad legs of the second plurality of pad legs when the first and second bond pads are aligned with each other upon being coupled; and wherein a third set of one or more pad legs of the first plurality of plurality of pad legs aligns with a fourth set of one or more pad legs of the second plurality of pad legs when the first and second bond pads are misaligned with each other upon being coupled.

In a further example, the present technology relates to an integrated module comprising: a first semiconductor die comprising at least a first group of bond pads, a first bond pad of the first group of bond pads divided into a first plurality of pad legs; and a second semiconductor die comprising a second group of bond pads, a second bond pad of the second group of bond pads divided into a second plurality of pad legs; means for aligning a first set of one or more pad legs of the first plurality of plurality of pad legs with a second set of one or more pad legs of the second plurality of pad legs when the first and second bond pads are aligned with each other upon being coupled; and means for aligning a third set of one or more pad legs of the first plurality of plurality of pad legs with a fourth set of one or more pad legs of the second plurality of pad legs when the first and second bond pads are misaligned with each other upon being coupled.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An integrated module comprising:
   a first component comprising at least a first group of bond pads, a first bond pad of the first group of bond pads divided into a first plurality of pad legs; and
   a second component comprising a second group of bond pads, a second bond pad of the second group of bond pads divided into a second plurality of pad legs, there being a different number of pad legs in the second plurality of pad legs than in the first plurality of pad legs, the second bond pad coupled to the first bond pad to electrically and physically couple the second component to the first component;
   wherein the different numbers of pad legs on the first and second bond pads are provided so that one or more of the pad legs of the first plurality of pad legs align with one or more of the pad legs of the second plurality of pad legs in at least one of two orthogonal directions, where the first and second bond pads are aligned with each other or misaligned with each other.

2. The integrated module of claim 1, wherein the first and second bond pads each have a length in a first direction and a length in a second direction orthogonal to the first direction, and wherein the number of pad legs of the first and second bond pads are different in the first direction and in the second direction.

3. The integrated module of claim 1, wherein the first and second bond pads each have a length in a first direction and a length in a second direction orthogonal to the first direction, and wherein the number of pad legs of the first and second bond pads are the same in one of the first and second directions.

4. The integrated module of claim 1, wherein the first and second bond pads each have a length in a first direction and a length in a second direction orthogonal to the first direction, and wherein the number of pad legs in the first plurality of pad legs in the first direction is one less than the number of pad legs in the second plurality of pad legs in the first direction.

5. The integrated module of claim 1, wherein the first and second bond pads each have a length in a first direction and a length in a second direction orthogonal to the first direction, and wherein the number of pad legs in the first plurality of pad legs in the first direction is between one and ten less than the number of pad legs in the second plurality of pad legs in the first direction.

6. The integrated module of claim 1, wherein a size of a pad leg in the first plurality of pad legs is different along a first direction than a size of a pad leg in the second plurality of pad legs along the first direction.

7. The integrated module of claim 1, wherein a pitch between pad legs in the first plurality of pad legs is different along a first direction than a pitch between pad legs in the second plurality of pad legs along the first direction.

8. The integrated module of claim 1, wherein the first and second components comprise first and second semiconductor dies.

9. The integrated module of claim 8, wherein the first semiconductor die comprises a plurality of memory cells, and the second semiconductor die comprises a control circuit for controlling access to the plurality of memory cells.

10. An integrated module comprising:
    a first semiconductor die comprising at least a first group of bond pads, a first bond pad of the first group of bond pads divided into a first plurality of pad legs; and
    a second semiconductor die comprising a second group of bond pads, a second bond pad of the second group of bond pads divided into a second plurality of pad legs;
    wherein a first set of one or more pad legs of the first plurality of plurality of pad legs aligns with a second set of one or more pad legs of the second plurality of pad legs when the first and second bond pads are aligned with each other upon being coupled; and
    wherein a third set of one or more pad legs of the first plurality of plurality of pad legs aligns with a fourth set of one or more pad legs of the second plurality of pad legs when the first and second bond pads are misaligned with each other upon being coupled.

11. The integrated module of claim 10, wherein there is a different number of pad legs in the first plurality of pad legs than there are in the second plurality of pad legs.

12. The integrated module of claim 10, wherein a size of the pad legs in the first plurality of pad legs is different than a size of the pad legs in the second plurality of pad legs.

13. The integrated module of claim 12, wherein the size of the pad legs in the first plurality of pad legs is different in only one dimension than the size of the pad legs in the second plurality of pad legs.

14. The integrated module of claim 12, wherein the size of the pad legs in the first plurality of pad legs is different in first and second orthogonal dimensions than the size of the pad legs in the second plurality of pad legs.

15. The integrated module of claim 10, wherein a pitch between the pad legs in the first plurality of pad legs is different than a pitch between the pad legs in the second plurality of pad legs.

16. The integrated module of claim 15, wherein the pitch between the pad legs in the first plurality of pad legs is different in only one dimension than the pitch between the pad legs in the second plurality of pad legs.

17. The integrated module of claim 15, wherein the pitch between the pad legs in the first plurality of pad legs is different in first and second orthogonal dimensions than the pitch between the pad legs in the second plurality of pad legs.

18. The integrated module of claim 10, wherein the integrated module comprises an integrated memory module.

19. An integrated module comprising:
a first semiconductor die comprising at least a first group of bond pads, a first bond pad of the first group of bond pads divided into a first plurality of pad legs; and
a second semiconductor die comprising a second group of bond pads, a second bond pad of the second group of bond pads divided into a second plurality of pad legs;
means for aligning a first set of one or more pad legs of the first plurality of plurality of pad legs with a second set of one or more pad legs of the second plurality of pad legs when the first and second bond pads are aligned with each other upon being coupled; and
means for aligning a third set of one or more pad legs of the first plurality of plurality of pad legs with a fourth set of one or more pad legs of the second plurality of pad legs when the first and second bond pads are misaligned with each other upon being coupled.

20. An integrated module comprising:
a first component comprising at least a first group of bond pads, a first bond pad of the first group of bond pads divided into a first plurality of pad legs; and
a second component comprising a second group of bond pads, a second bond pad of the second group of bond pads divided into a second plurality of pad legs, there being a different number of pad legs in the second plurality of pad legs than in the first plurality of pad legs, the second bond pad coupled to the first bond pad to electrically and physically couple the second component to the first component;
wherein the first and second bond pads each have a length in a first direction and a length in a second direction orthogonal to the first direction, and wherein the number of pad legs of the first and second bond pads are the same in one of the first and second directions.

* * * * *